US008994579B2

(12) United States Patent
Kobayashi

(10) Patent No.: US 8,994,579 B2
(45) Date of Patent: Mar. 31, 2015

(54) RF PULSE SIGNAL GENERATION SWITCHING CIRCUIT, RF PULSE SIGNAL GENERATING CIRCUIT, AND TARGET OBJECT DETECTING APPARATUS

(71) Applicant: FURUNO Electric Co., Ltd., Nishinomiya, Hyogo-Pref (JP)

(72) Inventor: Tomonao Kobayashi, Nishinomiya (JP)

(73) Assignee: FURUNO Electric Company Ltd., Nishinomiya (JP)

( * ) Notice: Subject to any disclaimer, the term of this patent is extended or adjusted under 35 U.S.C. 154(b) by 234 days.

(21) Appl. No.: 13/648,579

(22) Filed: Oct. 10, 2012

(65) Prior Publication Data

US 2013/0088378 A1 Apr. 11, 2013

(30) Foreign Application Priority Data

Oct. 11, 2011 (JP) ................. 2011-223570

(51) Int. Cl.
*G01S 13/04* (2006.01)
*H03K 3/02* (2006.01)
(Continued)

(52) U.S. Cl.
CPC . *G01S 7/282* (2013.01); *H03F 3/72* (2013.01); *G01S 7/03* (2013.01);
(Continued)

(58) Field of Classification Search
CPC ............... G01S 7/02; G01S 7/03; G01S 7/28; G01S 7/282; H03K 17/04; H03K 17/041; H03K 17/0416; H03K 17/04163; H03F 1/02; H03F 1/0205; H03F 1/0261; H03F 1/56; H03F 3/189; H03F 3/19; H03F 3/193; H03F 3/20; H03F 3/24; H03F 3/245; H03F 3/72; H03F 2200/15; H03F 2200/18; H03F 2200/21; H03F 2200/222; H03F 2200/27; H03F 2200/387; H03F 2203/72; H03F 2203/7203

USPC ..... 331/1 R, 5, 107 R, 108 R, 116 R, 116 FE; 326/93–98; 327/100, 172, 365, 419, 327/427–437, 181; 342/21, 27, 28, 82, 104, 342/118, 134, 175, 195, 202, 89
See application file for complete search history.

(56) References Cited

U.S. PATENT DOCUMENTS 3,636,372 A * 1/1972 Hujita et al. ................... 327/433
3,750,025 A * 7/1973 Ross ............................... 342/21
(Continued)

FOREIGN PATENT DOCUMENTS

| JP | 5-288829 A | * 11/1993 | ............... G01S 7/282 |
| JP | 4081035 B2 | 4/2008 | |
| SU | 535723 | * 11/1976 | ............... H03K 3/02 |

OTHER PUBLICATIONS

Search Report dated Jan. 24, 2013, for UK Application No. 1217744.0.

*Primary Examiner* — Bernarr Gregory
(74) *Attorney, Agent, or Firm* — Birch, Stewart, Kolasch & Birch, LLP

(57) ABSTRACT

An RF pulse signal generation switching circuit for controlling an output of a power FET for amplifying a high frequency signal to generate an RF pulse signal that is the high frequency signal pulse formed into a pulse-wave shape is provided. The circuit includes first and third n-type FETs of which gates are inputted with a control pulse that supplies a rise timing and a fall timing of a pulse, and a second n-type FET of which a gate is connected with a drain of the first FET. A source of the first FET and a source of the third FET are grounded, respectively. The drain of the first FET is applied with a first drive voltage via a resistor. A drain of the second FET is applied with a second drive voltage. A source of the second FET is connected with a drain of the third FET and the connection point therebetween is connected with the power FET. A capacitor is connected between the connection point and an end of the resistor from which the first drive voltage is applied.

6 Claims, 7 Drawing Sheets

(51) Int. Cl.

| | |
|---|---|
| *G01S 7/282* | (2006.01) |
| *H03F 3/72* | (2006.01) |
| *G01S 7/03* | (2006.01) |
| *H03K 17/0416* | (2006.01) |
| *H03K 17/06* | (2006.01) |
| *H03F 1/02* | (2006.01) |
| *H03F 1/56* | (2006.01) |
| *H03F 3/193* | (2006.01) |
| *H03F 3/24* | (2006.01) |
| *G01S 13/00* | (2006.01) |
| *H03K 3/00* | (2006.01) |

(52) U.S. Cl.
CPC ....... *H03K 17/04163* (2013.01); *H03K 17/063* (2013.01); *H03F 1/0261* (2013.01); *H03F 1/56* (2013.01); *H03F 3/193* (2013.01); *H03F 3/245* (2013.01); *H03F 2200/15* (2013.01); *H03F 2200/18* (2013.01); *H03F 2200/21* (2013.01); *H03F 2200/222* (2013.01); *H03F 2200/27* (2013.01); *H03F 2200/387* (2013.01); *H03F 2200/555* (2013.01); *H03F 2203/7203* (2013.01)
USPC ............. 342/27; 327/100; 327/181; 327/365; 327/419; 327/427; 342/82; 342/89; 342/175

(56) References Cited

U.S. PATENT DOCUMENTS

| | | | | |
|---|---|---|---|---|
| 3,896,425 | A * | 7/1975 | Erichsen | 342/27 |
| 3,996,482 | A * | 12/1976 | Lockwood | 327/172 |
| 4,097,853 | A * | 6/1978 | Francis, Jr. | 342/28 |
| 4,482,867 | A * | 11/1984 | Marchand et al. | 342/202 |
| 4,536,752 | A * | 8/1985 | Cheal et al. | 342/28 |
| 4,577,166 | A * | 3/1986 | Milberger et al. | 342/202 |
| 4,697,184 | A * | 9/1987 | Cheal et al. | 342/28 |
| 4,827,267 | A * | 5/1989 | Shearin | 342/202 |
| 4,884,077 | A * | 11/1989 | Landt | 342/202 |
| 4,952,941 | A * | 8/1990 | Landt | 342/202 |
| 5,083,861 | A * | 1/1992 | Chi | 342/134 |
| 5,111,084 | A | 5/1992 | Suko | |
| 5,451,962 | A * | 9/1995 | Steigerwald | 342/175 |
| 5,515,011 | A * | 5/1996 | Pasco | 331/5 |
| 6,169,449 | B1 | 1/2001 | Hasegawa | |
| 6,630,903 | B1 * | 10/2003 | Hann et al. | 342/175 |
| 6,700,532 | B2 * | 3/2004 | Kitabatake et al. | 342/175 |
| 6,919,739 | B2 * | 7/2005 | Ngo | 326/98 |
| 7,548,191 | B2 * | 6/2009 | Arayashiki et al. | 342/175 |
| 2002/0060640 | A1 * | 5/2002 | Davis et al. | 342/104 |

* cited by examiner

RF PULSE SIGNAL GENERATION SWITCHING CIRCUIT, RF PULSE SIGNAL GENERATING CIRCUIT, AND TARGET OBJECT DETECTING APPARATUS

CROSS-REFERENCE TO RELATED APPLICATION(S)

The application claims priority under 35 U.S.C. §119 to Japanese Patent Application No. 2011-223570, which was filed on Oct. 11, 2011, the entire disclosure of which is hereby incorporated by reference.

TECHNICAL FIELD

The present invention relates to an RF pulse signal generating circuit for generating a pulse transmission signal that is used in a target object detecting apparatus such as a radar apparatus, and a switching circuit used in the generating circuit.

BACKGROUND OF THE INVENTION

Conventionally, target object detecting apparatuses, such as radar apparatuses, have been performing detections of target objects by transmitting high frequency signals (RF signals) to detection ranges and receiving reflection signals that are the transmission signals respectively reflected on the target objects.

JP4081035B discloses a target object detecting apparatus that forms an RF signal into a pulse-wave shape and transmits the RF pulse signal with a predetermined pulse height only within a predetermined transmission period. Moreover, the target object detecting apparatus sets a period of time in which such an RF pulse signal with the predetermined pulse height is not transmitted as a reception period, and receives a reflection signal within the reception period. Further, recently, A-class and AB-class amplifications are used for purposes of applying to pulse compression processing and a C-class amplification is not used.

In order to generate such an RF pulse signal, an output from a power FET for amplifying an RF signal may be controlled, in which either one of a method of controlling a gate voltage of the power FET and a method of controlling a drain voltage of the power FET which is disclosed in JP4081035B is used.

FIG. 7A shows a circuit of a conventional drain switching circuit 21P for controlling a drain voltage of a general power FET, and FIG. 7B is an operation explanatory view of the general power FET. As illustrated in FIG. 7A, the conventional drain switching circuit 21P includes n-type field effect transistors (FETs) 211P and 213P and a p-type FET 212P. In the FET 211P, a gate is connected with a control pulse input terminal 214C, a source is grounded, and a drain is connected with a drive voltage input terminal 214D via a resistor 217P. The drain of the FET 211P is connected with gates of the FETs 212P and 213P.

In the FET 212P, a source is connected with the drive voltage input terminal 214D and a drain is connected with a drain of the FET 213P. A source of the FET 213P is grounded.

A control pulse signal is applied to the control pulse input terminal 214C, and a drive voltage Vds is applied to the drive voltage input terminal 214D.

A connection point in the drain switching circuit 21p with such a configuration between the drain of the FET 212P and the drain of the FET 213P is connected with a drain of the power FET. Further, an output Dcon of the drain switching circuit 21P is substantially 0 [V] of a LOW state within a period of time in which the control pulse signal is LOW, and a drain voltage of the power FET becomes substantially 0 [V]. The output Dcon of the drain switching circuit 21P is substantially Vds [V] of a HI state within a period of time in which the control pulse signal is H.

However, with the method of controlling the gate voltage of the power FET, although an operational amplifier is generally used, a fall time length of the general operational amplifier is long. Further, with an operational amplifier with high unity gain frequency (ft), although the fall time length is shorter, there is a problem of output waveform ringing, and stability in operation being LOW.

Moreover, the drain switching circuit 21P in FIG. 7A generally uses a MOSFET for each FET. However, the FET 212P used as a high-side FET is a p-type FET of which an input capacity is large and a responding speed of falling is slow. Therefore, as illustrated in the "212P response" of FIG. 7B, it does not shift to an OFF state rapidly at an end timing of a transmission period specified by the control pulse signal. Thus, the drive voltage is supplied to the drain of the power FET even after the transmission period ends (after a reception period starts). Therefore, a part of the transmission signal flows into a receiver, and a receiving sensitivity within a close distance range degrades immediately after the transmission period is switched to the reception period.

The present invention is made in view of the above situation, and provides an RF signal generation switching circuit that can rapidly fall a waveform of an RF pulse signal while operating stably, and an RF pulse signal generation circuit using the switching circuit.

SUMMARY OF THE INVENTION

According to an aspect of the invention, the present invention relates to an RF pulse signal generation switching circuit for controlling an output of a power FET for amplifying a high frequency signal to generate an RF pulse signal that is the high frequency signal pulse formed into a pulse-wave shape. The circuit includes first and third n-type FETs of which gates are inputted with a control pulse that supplies a rise timing and a fall timing of a pulse, and a second n-type FET of which a gate is connected with a drain of the first FET. A source of the first FET and a source of the third FET are grounded, respectively. The drain of the first FET is applied with a first drive voltage via a resistor. A drain of the second FET is applied with a second drive voltage. A source of the second FET is connected with a drain of the third FET and the connection point therebetween is connected with the power FET. A capacitor is connected between the connection point and an end of the resistor from which the first drive voltage is applied.

With this configuration, not only that a low side FET for ultimately controlling the output of an RF pulse signal generating circuit is the n-type FET but a high-side FET is also the n-type FET. Thus, the fall of the pulse is rapid. Moreover, a current is supplied to the gate of the high-side FET from a capacitor that is charged while the high-side FET is OFF. Thus, the voltage between the gate and the source of the high-side FET while shifting from OFF to ON is compensated, and the high-side FET can surely be turned on.

The RF pulse signal generation switching circuit may further include a fourth FET of which a drain is connected with the end of the resistor from which the first drive voltage of the capacitor is applied, a source is connected with the gate of the second FET, and a gate is connected with the drain of the first FET, a rectifying element arranged between the gate and the source of the fourth FET so that a cathode of the rectifying element is connected with the gate of the fourth FET, and a fifth FET of which a drain is connected with the gates of the first and third FETs and applied with a third drive voltage, a source is grounded, and a gate is inputted with the control pulse.

With this configuration, a gate current is supplied to the second FET that is the high-side FET while shifting from OFF to ON without passing through a resistor. Thus, a high gate current can be supplied to the high-side FET. In this manner, the high-side FET can be turned on more surely.

According to another aspect of the invention, an RF pulse signal generating circuit is provided, which includes the RF pulse signal generation switching circuit of the other aspect of the invention, and a power FET of which a drain is connected with the connection point between the source of the second FET and the drain of the third FET. A gate of the power FET is inputted with the high frequency signal.

With this configuration, by using the RF pulse signal generation switching circuit, the fall of a drain control pulse of a power FET becomes rapid. By using the drain control pulse with such waveform, the shift from ON to OFF of the supply of the drive voltage to the drain of the power FET can be rapid. In this manner, an RF pulse signal of which the pulse falls rapidly can be outputted.

The gate of the power FET may be connected with a gate control circuit for controlling a gate voltage of the power FET by the control pulse.

With this configuration, the gate voltage can be controlled simultaneously to but separately from the drain voltage of the power FET.

The RF pulse signal generating circuit may further include a gate voltage application controller for applying the gate voltage for turning on the gate of the power FET at a timing after the supply of a drive voltage to the drain of the power FET by the RF pulse signal generation switching circuit.

With this configuration, the gate of the power is turned on after the drain voltage of the power FET rises, and the RF signal is inputted to the gate of the power FET. Thus, the amplification operation of the power FET stabilizes. In this manner, a stable RF pulse signal can be generated According to further another aspect of the invention, a target object detecting device is provided, which includes a transmitter including the RF pulse signal generating circuit of any of the other aspects of the invention, a transception switch for outputting to an antenna the RF pulse signal outputted from the transmitter, and outputting to a receiver the reception signal that is the RF pulse reflected on a target object and received by the antenna, and the receiver for generating detection data of the target object based on the reception signal.

With this configuration, by providing the RF pulse signal generating circuit to the transmitter, a stable RF pulse signal of which the pulse falls rapidly is used and a target object detection can be performed. Thus, a transmission noise generated immediately after the switch from a transmission period to a reception period can be reduced and a receiving sensitivity can be improved. Therefore, a target object detecting performance in close distance can be improved.

BRIEF DESCRIPTION OF THE DRAWINGS

The present disclosure is illustrated by way of example and not by way of limitation in the figures of the accompanying drawings, in which the like reference numeral indicate like elements and in which.

DETAILED DESCRIPTION

An RF pulse signal generation switching circuit, an RF pulse signal generating circuit, and a target object detecting apparatus according to an embodiment of the invention are described with reference to the appended drawings. Note that, in this embodiment, the target object detecting apparatus is described by using a radar apparatus as an example. However, the configuration of the present invention can be applied to other apparatuses that use a pulse-wave shaped RF signal as a transmission signal (e.g., sonar apparatuses and school-of-fish detecting apparatuses).

Figure 1:
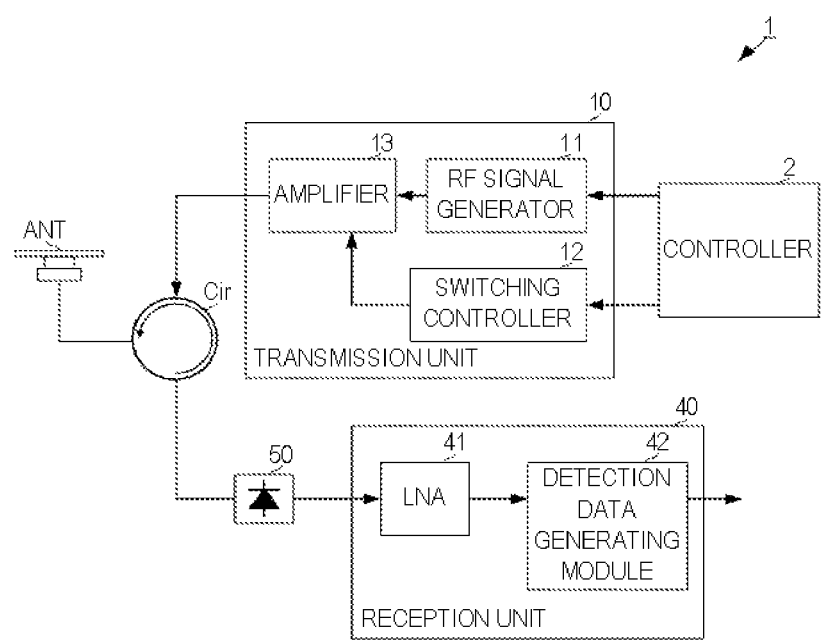
FIG. 1 is a block diagram illustrating a main configuration of a radar apparatus 1 according to an embodiment of the present invention.

FIG. 1 is a block diagram illustrating a main configuration of a radar apparatus 1 according to this embodiment. The radar apparatus 1 includes a controller 2, a transmission unit 10 (corresponding to the "RF pulse signal generating circuit" in the claims), a reception unit 40, a limiter 50, a circulator Cir, and an antenna ANT.

The controller 2 performs an overall control, such as a power control, of the radar apparatus 1 and a transmission control thereof. Specifically, the controller 2 generates an RF control signal for supplying a generating timing of a high frequency signal (RF signal), and outputs it to an RF signal generator 11 of the transmission unit 10. Further, the controller 2 generates a control pulse Pcon for forming the RF signal into a pulse-wave shape on a time axis. The control pulse Pcon is a signal constituted with two values of HI and LOW. The controller 2 outputs the control pulse Pcon to a switching controller 12 of the transmission unit 10.

The transmission unit 10 includes the RF signal generator 11, the switching controller 12, and an amplifier 13. The RF signal generator 11 generates a high frequency signal (RF signal) at a predetermined frequency (e.g., frequency in a GHz band). The RF signal generator 11 outputs the RF signal to the amplifier 13.

Specific circuit configurations and operations of the switching controller 12 and the amplifier 13 are described later. Schematically, a drain voltage of the power FET 31 of the amplifier 13 is controlled by a drain switching circuit 21 (corresponding to the "RF pulse signal generation switching circuit" in the claims) of the switching controller 12. Moreover, a gate voltage of the power FET 31 is controlled by a gate switching circuit 22 of the switching controller 12. By such controls of the gate and drain voltages, the RF signal amplified by the power FET 31 is outputted in a pulse-wave shape. Note that, here, each voltage of the power FET 31 (described later) is controlled so as to be A-class amplified or AB-class amplified. Such an RF pulse signal outputted from the amplifier 13 is outputted to the circulator Cir.

The circulator Cir transmits the transmission signal constituted with the RF pulse signal to the antenna ANT. The antenna ANT radiates a radio wave as the transmission signal.

The antenna ANT receives a reflection signal obtained from the transmission signal reflecting on a target object, and outputs the reception signal to the circulator Cir. The circulator Cir outputs the reception signal to the limiter 50. The limiter 50 limits the signal to be inputted thereto from the circulator Cir to below a predetermined level. The reception signal outputted from the limiter 50 is transmitted to the reception unit 40.

The reception unit 40 includes a low-noise amplifier (LNA) 41 and a detection data generating module 42. The LNA 41 amplifies the reception signal and outputs it to the detection data generating module 42. The detection data generating module 42 samples the amplified reception signal at predetermined time intervals to generate detection data. Here, when the detection data generating module 42 uses an FM chirp signal for the RF signal, it may perform a pulse compression by multiplication processing between the detection data and the RF signal. Moreover, the detection data generating module 42 may detect a target object around the radar apparatus based on a level of the detection data and/or display a target object detection image of around the radar apparatus based on the detection data. A known method may be used in such detection of the target object and generation of the target object detection image (detailed description is omitted here).

Figure 2:
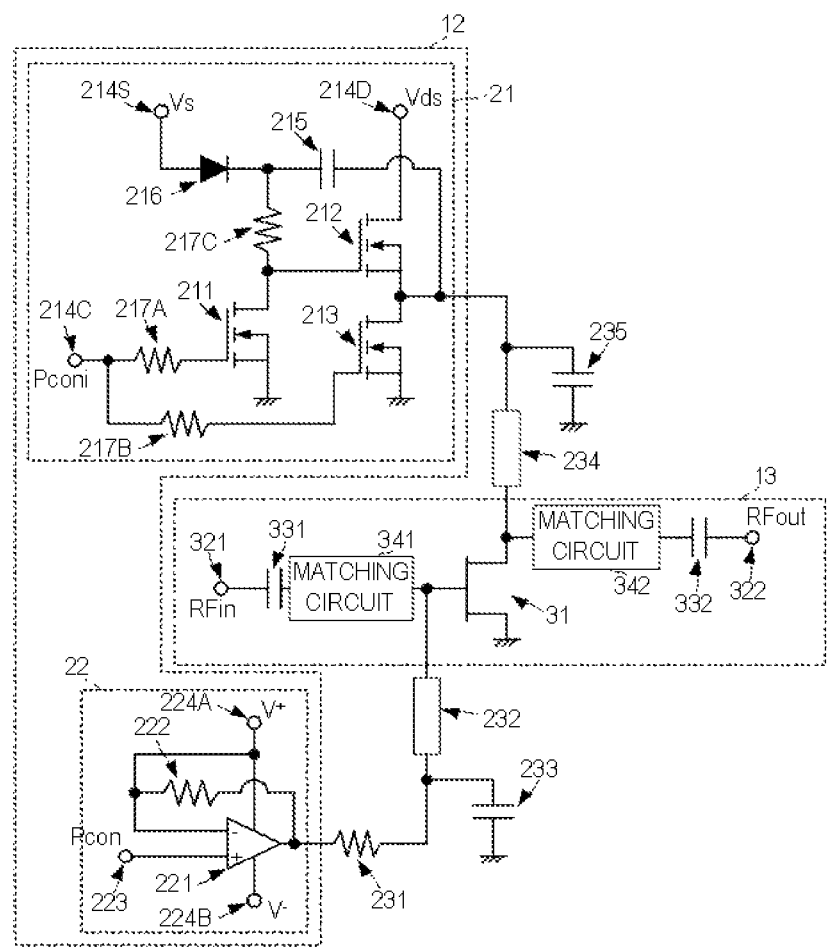
FIG. 2 shows a circuit of a switching controller 12 and an amplifier 13.
Figure 3:
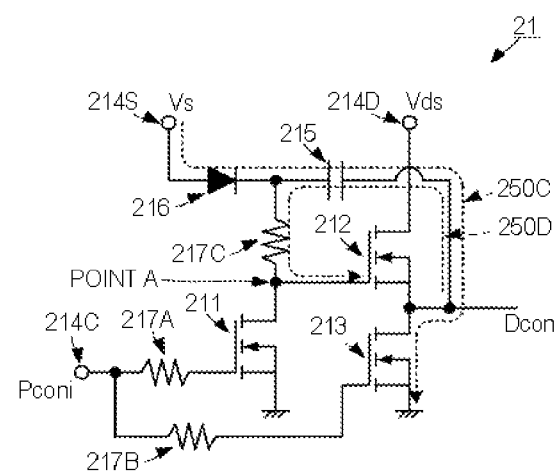
FIG. 3 is a view illustrating an operation of a drain switching circuit 21.

Next, the specific circuit configurations and operations of the switching controller 12 and the amplifier 13 are described. FIG. 2 shows a circuit of the switching controller 12 and the amplifier 13. FIG. 3 is a view for illustrating the operation of the drain switching circuit 21.

As illustrated in FIG. 2, the drain switching circuit 21 of the switching controller 12 includes a first FET 211, a second FET 212, and a third FET 213. These first, second and third FETs 211, 212 and 213 are realized by an n-type MOSFET.

In the first FET 211, a gate is connected with a control pulse input terminal 214C via a resistor 217A, a source is grounded, and a drain is connected with a gate of the second FET 212.

Further, the drain of the first FET 211 is connected with a first drive voltage input terminal 214S via a resistor 217C and a diode 216. Here, the diode 216 is connected so that an anode thereof is located on a side of the first drive voltage input terminal 214S and a cathode thereof is located on a side of the resistor 217C.

In the second FET 212 that serves as a high-side FET, a gate is connected with the drain of the first FET 211 and the resistor 217C, a drain is connected with a second drive voltage input terminal 214D, and a source is connected with a drain of the third FET 213.

A capacitor 215 is connected between the source of the second FET 212 and a connection point between the diode 216 and the resistor 217C.

In the third FET 213 that serves as a low-side FET, a gate is connected with the control pulse input terminal 214C via a resistor 217B, a source is grounded, and the drain is connected with the source of the second FET 212.

A connection point between the source of the second FET 212 and the drain of the third FET 213 is connected with a drain of the power FET 31 of the amplifier 13 via an inductor 234. Note that, the connection point is grounded via a capacitor 235.

The first drive voltage input terminal 214S is applied with a first drive voltage Vs. The second drive voltage input terminal 214D is applied with a second drive voltage Vds.

Figure 4:
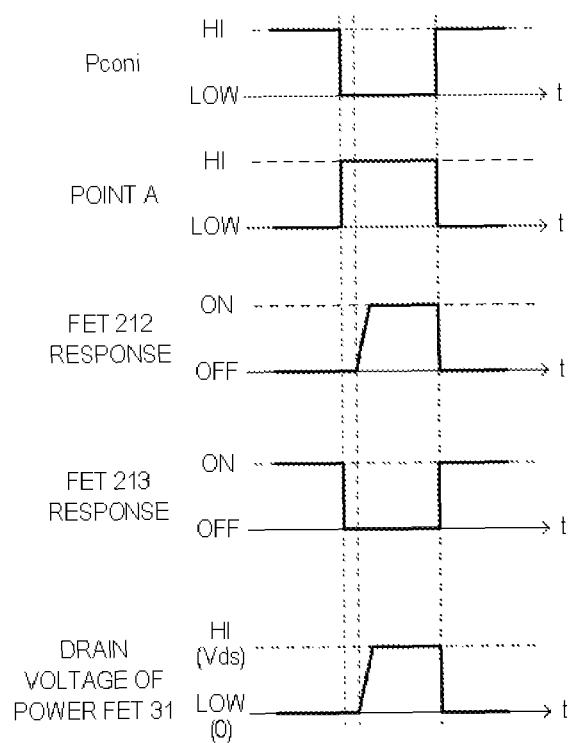
FIG. 4 is a state shifting timing chart of components of the drain switching circuit 21.

In such a circuit configuration, when a control pulse Pconi obtained by inverting the control pulse Pcon is inputted to the control pulse input terminal 214C, the drain switching circuit 21 operates as below. Note that, the control pulse Pconi can be obtained by providing an inversing circuit on the upstream of the control pulse input terminal 214C or being generated simultaneously to the control pulse Pcon by the controller 2. FIG. 4 is a state shifting timing chart of components of the drain switching circuit 21.

When the control pulse Pconi is in a HI state, a gate voltage of the first FET 211 increases and the first FET 211 shifts to an ON state. Therefore, the drain of the first FET 211 (i.e., the point A in FIG. 3) is grounded via the drain to source of the first FET 211 and shifts to a LOW state. In this manner, a gate voltage of the second FET 212 decreases, the second FET 212 shifts to an OFF state, and no current is conducted between the drain and the source of the second FET 212.

Moreover, when the control pulse Pconi is in the HI state, a gate voltage of the third FET 213 increases and the third FET 213 shifts to an ON state. Therefore, the drain of the third FET 213 (i.e., the connection point between the drain of the third FET 213 and the source of the second FET 212) is grounded via the drain to source of the third FET 213 and shifts to a LOW state.

In this manner, a drain voltage of the power FET 31 connected with the connection point between the source of the second FET 212 and the drain of the third FET 213 shifts to a LOW state (substantially 0 [V]).

Moreover, the second FET 212 is in the OFF state and the third FET 213 is in the ON state. Therefore, as illustrated by the broken line 250C in FIG. 3, a current due to the first drive voltage Vs flows through the diode 216, the capacitor 215, and the drain to source of the third FET 213, and thus, the capacitor 215 is charged.

Next, when the control pulse Pconi shifts from the HI state to the LOW state, the gate voltages of the first and third FETs 211 and 213 decrease, and the first and third FETs 211 and 213 shifts to the OFF state.

Thus, a drain voltage of the first FET 211 (i.e., a voltage at the point A in FIG. 3) increases. Here, a drain voltage of the third FET 213 (i.e., a source voltage of the second FET 212 also increases. Therefore, in this situation, a voltage between the gate and source of the second FET 212 is low and the second FET 212 cannot be turned on.

However, with the configuration of this embodiment, when the first FET 211 and the third FET 213 are in the OFF state, as illustrated by the broken line 250D in FIG. 3, a charge that is charged in the capacitor 215 is supplied to the gate of the second FET 212 via the resistor 217C. Moreover, when a gate-source voltage of the second FET 212 exceeds a gate-source voltage threshold due to the charge supply from the capacitor 215, a gate current flows, and the second FET 212 shifts to the ON state.

When the second FET 212 shifts to the ON state, a current is conducted between the drain and source of the second FET 212, and the voltage at the connection point between the source of the second FET 212 and the drain of the third FET 213 increases to the second drive voltage Vds. Thus, the drain voltage of the power FET 31 becomes the HI state (substantially Vds [V]).

As above, by using the configuration of this embodiment, even when an n-type FET is used as the high-side FET, the drain voltage of the power FET 31 can shift from the LOW state (substantially 0 [V]) to the HE state (substantially Vds [V]) surely and stably based on the control pulse.

Next, when the control pulse Pconi shifts from the Low state to the HI state again, the gate voltages of the first and third FETs 211 and 213 increase, and the first and third FETs 211 and 213 become the ON state. Because the sources of the first and third FETs 211 and 213 are grounded, when the control pulse Pconi shifts from the LOW state to the HI state, the first and third FETs 211 and 213 rapidly shift to the ON state.

Further, due to the decrease of the drain voltage of the first FET 211, the second FET 212 becomes the OFF state. Here, because the second FET 212 is an n-type FET having higher electron mobility, in other words, smaller input capacitance, than a p-type FET and the gate of the second FET 212 is connected to the drain of the first FET 211, the charge that is charged in the input capacitance when the second FET 212 is in the ON state is discharged rapidly to the ground via the drain to source of the first FET 211. Moreover, the source of the second FET 212 is grounded via the third FET 213 that is in the ON state. Therefore, the charge that remains in the second FET 212 is also discharged rapidly to the ground via the drain to source of the third FET 213. Thus, the second FET 212 shifts from the ON state to the OFF state rapidly. Note that, when the second FET 212 shifts to the OFF state as above, the capacitor 250 is again charged as described above.

By having such a configuration, at a timing at which the control pulse Pconi shifts from the LOW state to the HI state, the drain voltage of the power FET 31 can be controlled to the LOW state (substantially 0 [V]) rapidly.

Moreover, by repeating the above operations, the HI and LOW states of the drain voltage of the power FET 31 can stably be controlled according to the control pulse Pconi, and the speed of shifting the drain voltage from the HI state to the LOW state can be accelerated.

The gate switching circuit 22 includes an operational amplifier 221. The operational amplifier 221 applies a positive drive voltage V$^+$ and a negative drive voltage V$^-$ via a positive voltage application terminal 224A and a negative voltage application terminal 224B, respectively. A non-inverting input terminal of the operational amplifier 221 is connected with a control pulse input terminal 223. An inverting input terminal of the operational amplifier 221 is connected with the positive voltage application terminal 224A. An output terminal of the operational amplifier 221 is connected with the inverting input terminal via a resistor 222. The output terminal of the operational amplifier 221 is also connected with a gate of the power FET 31 via a resistor 231 and an inductor 232. A connection point between the resistor 231 and the inductor 232 is grounded via a capacitor 233.

Figure 5:
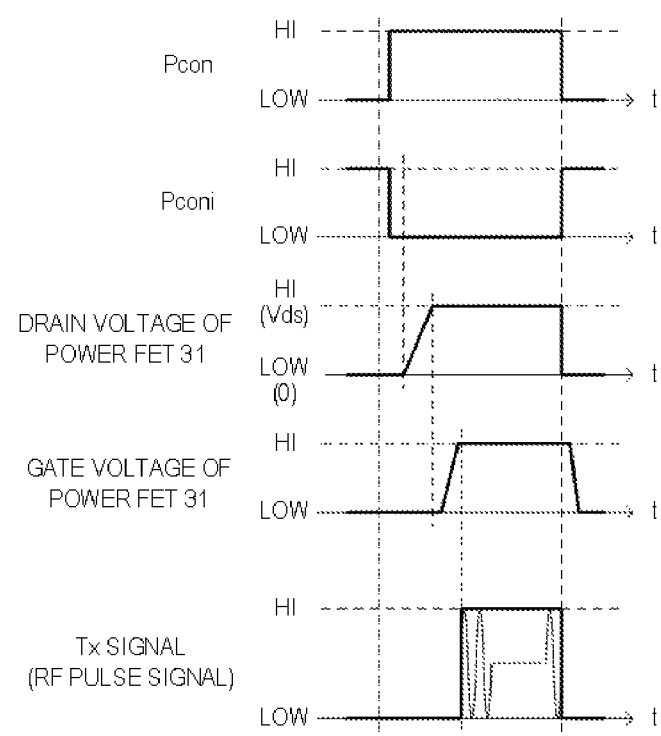
FIG. 5 is a state shifting timing chart of components of the switching controller 12 and the amplifier 13.

By using the gate switching circuit 22 with such configuration, a gate voltage control of the power FET 31 can be performed as follows. FIG. 5 is a state shifting timing chart of components of the switching controller 12 and the amplifier 13.

With the configuration described above, in the gate switching circuit 22, when the control pulse Pcon is inputted to the control pulse input terminal 223, a gate control signal for changing a voltage value is outputted according to the HI-LOW shift of the control pulse Pcon. By the voltage of the gate control signal, the gate voltage of the power FET 31 is controlled.

More specifically, as illustrated in FIG. 5, the gate voltage of the power FET 31 is controlled to the HI state (e.g., a predetermined positive voltage) at a timing retarded by a predetermined time length from a timing at which the control pulse Pcon shifts to the HI state. Here, as illustrated in FIG. 5, the timing at which the gate voltage rises to the HI state is set to be after the drain voltage of the power FET 31 is controlled to the HI state by the drain switching circuit 21. Note that, although the timing control can be achieved by respective element properties of the gate switching circuit 22 or the like, it may alternatively be achieved by providing a separate delay circuit. Further, the rise timing of the control pulse Pcon (the timing of shifting from the LOW state to the HI state) of the controller 2 may be retarded by a predetermined time length from the fall timing of the control pulse Pconi that is an inverted pulse of the control pulse Pcon (the timing of shifting from the HI state to the LOW state) to output the control pulses Pcon and Pconi.

Moreover, as illustrated in FIG. 5, the gate voltage of the power FET 31 is controlled to the LOW state (e.g., a predetermined negative voltage) at a timing retarded by a predetermined time length from the timing at which the control pulse Pcon shifts to the LOW state.

The amplifier 13 includes the power FET 31. The power FET 31 is achieved by a high output FET configured with a GaAs semiconductor or the like. The gate of the power FET 31 is connected with an RF input terminal 321 via an input matching circuit 341 and an input capacitor 331. A source of the power FET 31 is grounded. A drain of the power FET 31 is connected with an RF output terminal 322 via an output matching circuit 342 and an output capacitor 332.

The RF input terminal 321 is inputted with the RF signal outputted from the RF signal generator 11. The power FET 31 amplifies the RF signal during a period in which the drain voltage and the gate voltage are controlled to the HI state, and outputs it to the RF output terminal 322.

More specifically, as illustrated in FIG. 5, firstly based on the control pulse Pconi, the drain voltage of the power FET 31 is controlled to the HI state and the drive voltage Vds is supplied to the drain of the power FET 31. Next, based on the control pulse Pcon, the gate voltage of the power FET 31 is controlled to the HI state. When the drain and gate voltages are controlled to the HI state, the power FET 31 amplifies the RF signal. Therefore, an electrical potential of the RF output terminal shifts from the LOW state to the HI state. Thus, a rising waveform of the RF pulse signal is formed.

Next, based on the control pulse Pconi, when the drain voltage of the power FET 31 is controlled to the LOW state, the supply of the drive voltage Vds to the drain of the power FET 31 stops. Thus, the amplification by the power FET 31 stops, and the output of the RF signal is interrupted. According to this amplification stop, the electrical potential of the RF output terminal shifts from the HI state to the LOW state and, thereby, a falling waveform of the RF pulse signal is formed.

Here, as described above, by using the drain switching circuit 21 of this embodiment, the drain voltage of the power FET 31 can quickly be shifted to the LOW state and, thus, the falling waveform of the RF pulse signal can be steep. In this manner, even immediately after the fall of the RF pulse signal (i.e., immediately after the switch from the transmission period to the reception period), the RF pulse signal is not outputted from the transmission unit 10.

Moreover, because the waveform of the RF pulse signal is shaped by the control of the drain voltage of the power FET 31, it can be prevented that a transmission noise generated by an idling current due to general A-class and AB-class amplifications (when the RF signal is not applied) is outputted from the RF output terminal 322 (i.e., the transmission unit 10).

Thus, a degradation of the receiving sensitivity of the reception unit 40 during a period immediately after the fall of the RF pulse signal can be prevented. Therefore, a performance of detecting a target object existing near the radar apparatus can be improved.

Moreover, although the gate voltage of the power FET 31 is in the HI state for a predetermined period of time even after the drain voltage decreases, due to the decrease of the drain voltage, the RF signal is not outputted to the RF output terminal 322. Thus, the operation amplifier of which a voltage falls slowly but that can output positive and negative voltages can be used in the gate switching circuit 22. Therefore, a circuit for controlling a gate voltage of the power FET 31 that requires positive and negative gate voltages can be achieved with a comparatively simple structure.

Figure 6:
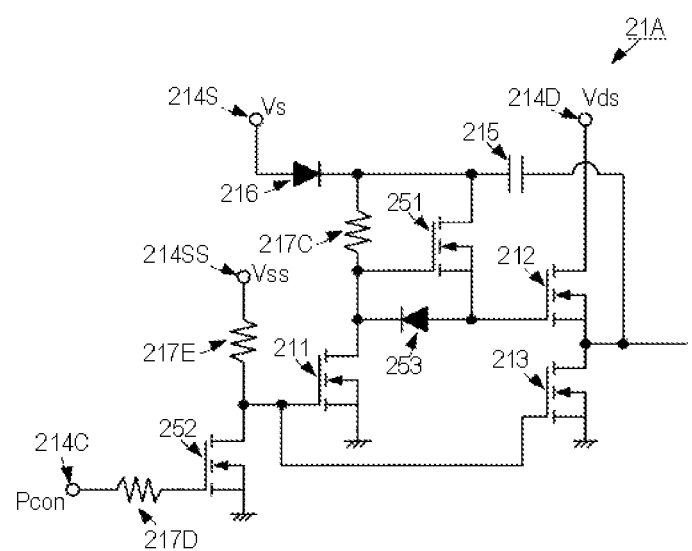
FIG. 6 shows a circuit of a drain switching circuit 21A with another circuit configuration according to the embodiment of the present invention.
Figure 7A:
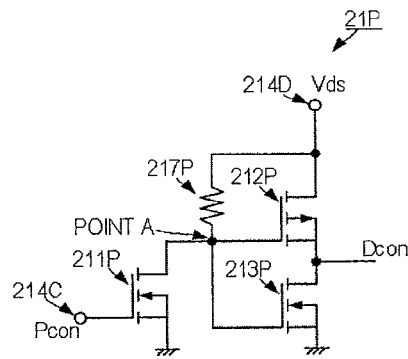
FIG. 7A shows a circuit of a conventional drain switching circuit 21P for controlling a drain voltage of a general power FET.
Figure 7B:
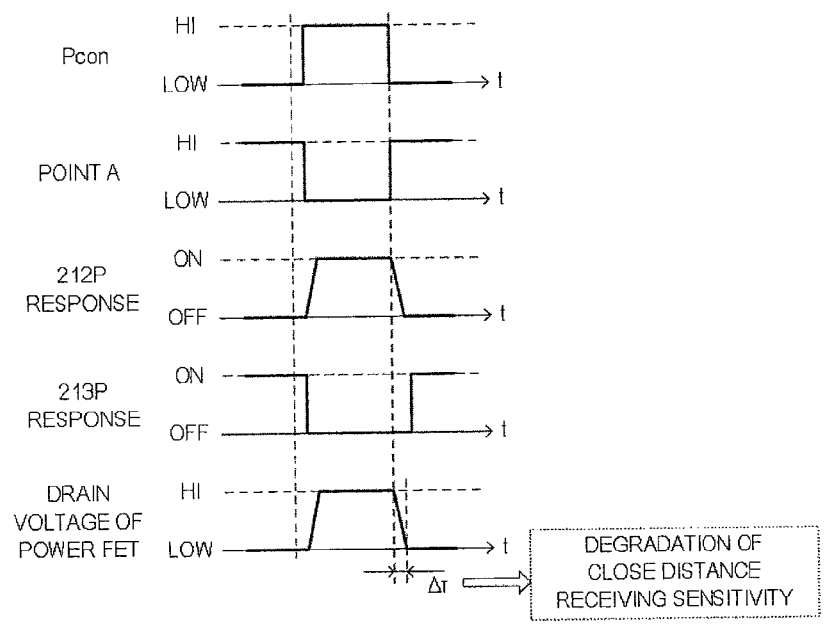
FIG. 7B is an operation explanatory view thereof.

Next, another circuit configuration of the drain switching circuit is described with reference to the drawings. FIG. 6 shows a circuit of a drain switching circuit 21A with another circuit configuration according to the embodiment of the present invention. The drain switching circuit 21A illustrated in FIG. 6 is the drain switching circuit 21 illustrated in FIGS. 2 and 3 added with a fourth FET 251, a fifth FET 252, and a rectifying element 253, and changed in its circuit configurations of the first FET 211 and the third FET 213 on their gate sides and its circuit configuration connecting to the drain of the first FET 211 and the gate of the second FET 212.

Each of the fourth and fifth FETs 251 and 252 is achieved by an n-type MOSFET.

The gates of the first and third FETs 211 and 213 are connected with a drain of the fifth FET 252. A connection point therebetween is connected with a third drive voltage application terminal 214SS via a resistor 217. The third drive voltage application terminal 214SS is applied with a third drive voltage Vss.

A gate of the fifth FET 252 is connected with the control pulse input terminal 214C via a resistor 217D. A source of the fifth FET 252 is grounded.

The source of the first FET 211 is grounded. The drain of the first FET 211 is connected with a gate of the fourth FET 251. A source of the fourth FET 251 is connected with the gate of the second FET 212.

Moreover, the drain of the first FET 211 is connected with the gate of the second FET 212 via a diode 253. In other words, the source and gate of the fourth FET 251 are connected with each other via the diode 253. Here, an anode of the diode 253 is connected with the gate of the second FET 212 (the source of the fourth FET 251) and a cathode of the diode 253 is connected with the drain of the first FET 211 (the gate of the fourth FET 251).

Moreover, the drain of the first FET 211 is connected with the first drive voltage input terminal 214S via the resistor 217C and the diode 216. Here, the anode of the diode 216 is connected with the first drive voltage input terminal 214S and the cathode of the diode 216 is connected with the resistor 217C.

The drain of the second FET 212 is connected with the second drive voltage input terminal 214D. The source of the second FET 212 is connected with the drain of the third FET 213.

The capacitor 215 is connected between the source of the second FET 212 and the connection point between the diode 216 and the resistor 217C. Further, an end of the capacitor 215 on the side of the connection point between the diode 216 and the resistor 217C is connected with a drain of the fourth FET 251.

The source of the third FET 213 is grounded. The drain of the third FET 213 is connected with the source of the second FET 212.

The connection point between the source of the second FET 212 and the drain of the third FET 213 is connected with the drain of the power FET 31 of the amplifier 13 similar to FIG. 2.

In the drain switching circuit 21A of FIG. 6 with such a configuration, the ON-OFF state of the first FET 211 is inversed with respect to the ON-OFF state of the fifth FET 252. Therefore, when the control pulse Pcon is inputted to the control pulse input terminal 214C, the control similar to the state illustrated in FIGS. 2 and 3 in which the control pulse Pcon1 is inputted to the gate of the first FET 211 becomes available.

Moreover, when the first FET 211 is in the ON state, the fourth FET 251 is in the OFF state and the second FET 212 is also in the OFF state. Thus, the capacitor 215 is charged by the first drive voltage Vs similar to the case of FIG. 3.

On the other hand, when the first FET 211 is in the OFF state, the fourth FET 215 is in the ON state. Therefore, the charge that is charged by the capacitor 215 is supplied to the gate of the second FET 212 via the drain to source of the fourth FET 251. In this manner, similar to the case of FIG. 3, a stable switching operation can be achieved.

Moreover, with the configuration in FIG. 6, the charge can be fed via the drain to source of the fourth FET 215 without passing the resistor 217C. Thus, a feeding charge amount can be increased to be higher than in the circuit illustrated in FIGS. 2 and 3, and the second FET 212 can further surely be turned on.

Further, the similar operation to the drain switching circuit 21 illustrated in FIGS. 2 and 3 is performed with the configuration in FIG. 6. Therefore, only one kind of the control pulse, the control pulse Pcon is required to be generated, and the configuration and the processing of generating the control pulse can be simplified.

In the foregoing specification, specific embodiments of the present invention have been described. However, one of ordinary skill in the technique appreciates that various modifications and changes can be performed without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. An RF pulse signal generation switching circuit for controlling an output of a power FET for amplifying a high frequency signal to generate an RF pulse signal that is the high frequency signal pulse formed into a pulse-wave shape, comprising:

first and third n-type FETs of which gates are inputted with a control pulse generated by a controller, wherein the control pulse supplies a rise timing and a fall timing of a pulse; and a second n-type FET of which a gate is connected with a drain of the first FET, wherein a source of the first FET and a source of the third FET are grounded, respectively, wherein the drain of the first FET is supplied with a first drive voltage via a resistor, wherein a drain of the second FET is supplied with a second drive voltage, wherein a source of the second FET is connected with a drain of the third FET via a connection point and said connection point between the source of the second FET and the drain of the third FET is connected with the power FET, and wherein a capacitor is connected between said connection point and an end of the resistor from which the first drive voltage is supplied.

2. The circuit of claim 1, further comprising a fourth FET of which a drain is connected with the end of the resistor from which the first drive voltage is supplied, a source is connected with the gate of the second FET, and a gate is connected with the drain of the first FET;
- a rectifying element arranged between the gate and the source of the fourth FET so that a cathode of the rectifying element is connected with the gate of the fourth FET; and
- a fifth FET of which a drain is connected with the gates of the first and third FETs and applied with a third drive voltage, a source is grounded, and a gate is inputted with the control pulse.

3. An RF pulse signal generating circuit, comprising:
a power FET; and
an RF pulse signal generation switching circuit for controlling an output of the power FET for amplifying a high frequency signal to generate an RF pulse signal that is the high frequency signal pulse formed into a pulse-wave shape, the RF pulse signal generation switching circuit comprising:
- first and third n-type FETs of which gates are inputted with a control pulse generated by a controller, wherein the control pulse supplies a rise timing and a fall timing of a pulse; and
- a second n-type FET of which a gate is connected with a drain of the first FET,
wherein a source of the first FET and a source of the third FET are grounded, respectively,
wherein the drain of the first FET is supplied with a first drive voltage via a resistor,
wherein a drain of the second FET is supplied with a second drive voltage,
wherein a source of the second FET is connected with a drain of the third FET via a connection point and said connection point between the source of the second FET and the drain of the third FET is connected with a drain of the power FET,
wherein a capacitor is connected between said connection point and an end of the resistor from which the first drive voltage is supplied, and
wherein a gate of the power FET is inputted with the high frequency signal.

4. The circuit of claim 3, wherein the gate of the power FET is connected with a gate control circuit for controlling a gate voltage of the power FET by the control pulse.

5. The circuit of claim 4, further comprising a gate voltage application controller for applying the gate voltage for turning on the gate of the power FET at a timing after the supply of a drive voltage to the drain of the power FET by the RF pulse signal generation switching circuit.

6. A target object detecting device, comprising:
a transmitter including an RF pulse signal generating circuit, the RF pulse signal generating circuit comprising:
a power FET; and
an RF pulse signal generation switching circuit for controlling an output of the power FET for amplifying a high frequency signal to generate an RF pulse signal that is the high frequency signal pulse formed into a pulse-wave shape, the RF pulse signal generation switching circuit comprising:
- first and third n-type FETs of which gates are inputted with a control pulse generated by a controller, wherein the control pulse supplies a rise timing and a fall timing of a pulse; and
- a second n-type FET of which a gate is connected with a drain of the first FET,
wherein a source of the first FET and a source of the third FET are grounded, respectively,
wherein the drain of the first FET is supplied with a first drive voltage via a resistor,
wherein a drain of the second FET is supplied with a second drive voltage,
wherein a source of the second FET is connected with a drain of the third FET via a connection point and said connection point between the source of the second FET and the drain of the third FET is connected with a drain of the power FET,
wherein a capacitor is connected between said connection point and an end of the resistor from which the first drive voltage is supplied, and
wherein a gate of the power FET is inputted with the high frequency signal;
a transception switch for outputting to an antenna the RF pulse signal outputted from the transmitter, and outputting to a receiver the reception signal that is the RF pulse reflected on a target object and received by the antenna; and
the receiver for generating detection data of the target object based on the reception signal.

* * * * *